United States Patent [19]

Colles

[11] Patent Number: 4,860,011
[45] Date of Patent: Aug. 22, 1989

[54] FLASH ANALOG-TO-DIGITAL CONVERTER

[75] Inventor: Joseph H. Colles, Oceanside, Calif.

[73] Assignee: Brooktree Corporation, San Diego, Calif.

[21] Appl. No.: 923,632

[22] Filed: Oct. 27, 1986

[51] Int. Cl.[4] .............................................. H03M 1/36
[52] U.S. Cl. ...................................... 341/133; 341/159
[58] Field of Search ................... 330/69; 340/347 AD, 340/347 DA, 347 M; 341/133, 136, 155, 159

[56] References Cited

U.S. PATENT DOCUMENTS 4,150,366  4/1979  Price ............................ 340/347 DA
4,596,978  6/1986  Fujita ............................ 340/347 M

OTHER PUBLICATIONS

Analog-Digital Conversion Notes, Analog Devices Inc., 1980, pp. 125, 126.
Microelectronic Circuits, Holt, Rinehart, and Winston, 1982, pp. 437,438,729,764,765.

Primary Examiner—William M. Shoop, Jr.
Assistant Examiner—Marc S. Hoff
Attorney, Agent, or Firm—Ellsworth R. Roston; Charles H. Schwartz

[57] ABSTRACT

First and second reference voltages of different value are introduced to opposite ends of a first line disposed on an IC chip and made from a suitable material (e.g. ion-implanted polysilicon). An input voltage having a value between such reference voltages is provided on a second line on the chip. The second line may be substantially parallel to the first line and made from a suitable material (e.g. polysilicon heavily implanted with ions) to provide an identical voltage at every line position. Bridging layers substantially perpendicularly disposed between the lines at progressive positions on the lines may be made from polysilicon heavily implanted with ions. The magnitudes of the line and reference voltages at each bridging layer are compared in a differential amplifier to produce a signal with a polarity dependent upon such relative magnitudes. The signals from the differential amplifiers are combined in pluralities of logical networks. Each network includes two series transistors, one receiving the signal from one comparator with a relatively low reference voltage to produce a signal with a first logic level and the other receiving the signal from another comparator with an increased reference voltage to produce a signal with a second logic level. Each network has a binary significance dependent upon the relative values of the binary signals introduced to the transistors in the network. The networks of each binary significance are connected to a binary bit line of corresponding binary significance to produce on such line a signal representing the input voltage.

21 Claims, 2 Drawing Sheets

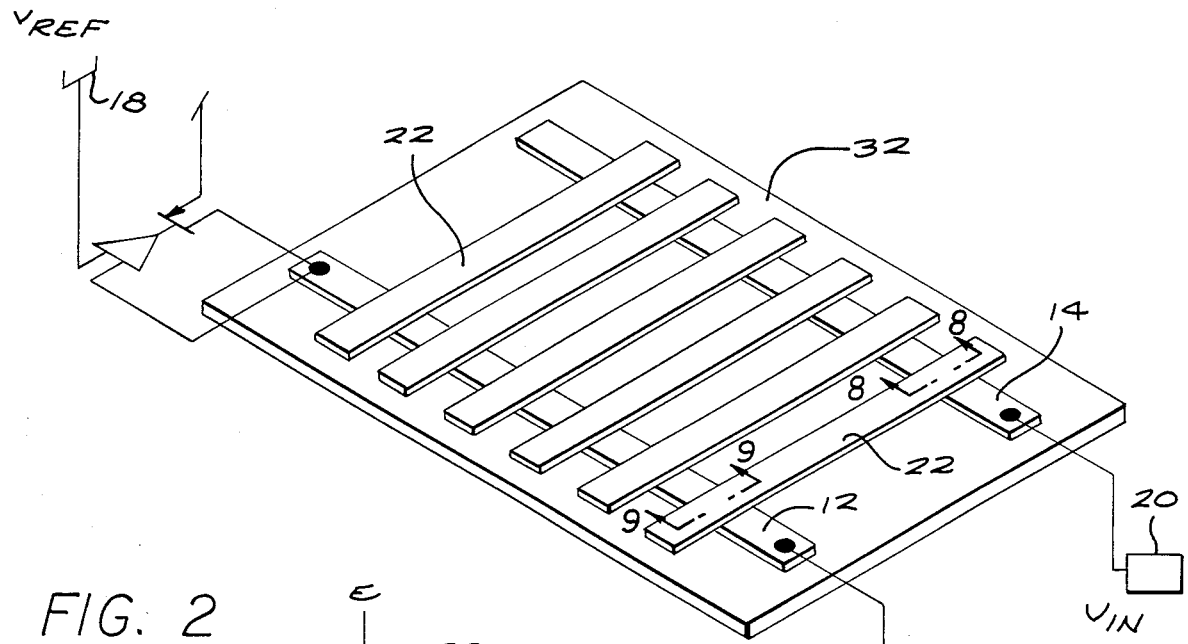
FIG. 1
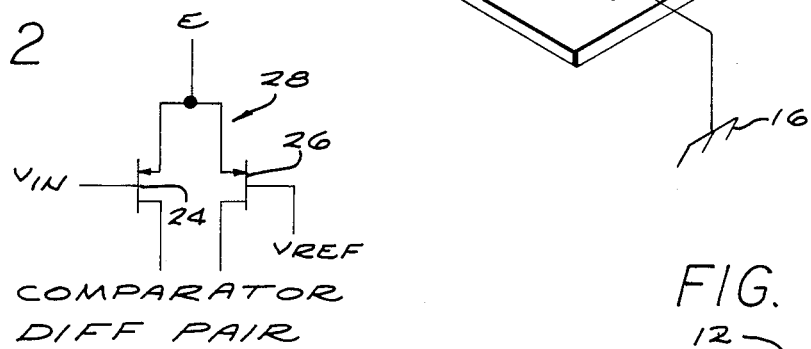
FIG. 2
COMPARATOR
DIFF PAIR
| BINARY OUTPUT SIGNALS | | | OUTPUTS FROM BRIDGING AMPLIFIERS 28 | | | | | | |
|---|---|---|---|---|---|---|---|---|---|
| BIT 2 | BIT 1 | BIT 0 | 1 | 2 | 3 | 4 | 5 | 6 | 7 |
| 0 | 0 | 0 | L | L | L | L | L | L | L |
| 0 | 0 | 1 | H | L | L | L | L | L | L |
| 0 | 1 | 0 | H | H | L | L | L | L | L |
| 0 | 1 | 1 | H | H | H | L | L | L | L |
| 1 | 0 | 0 | H | H | H | H | L | L | L |
| 1 | 0 | 1 | H | H | H | H | H | L | L |
| 1 | 1 | 0 | H | H | H | H | H | H | L |
| 1 | 1 | 1 | H | H | H | H | H | H | H |
FIG. 3
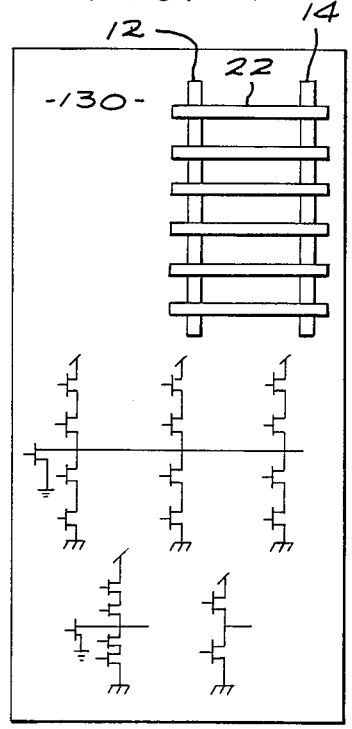
FIG. 7

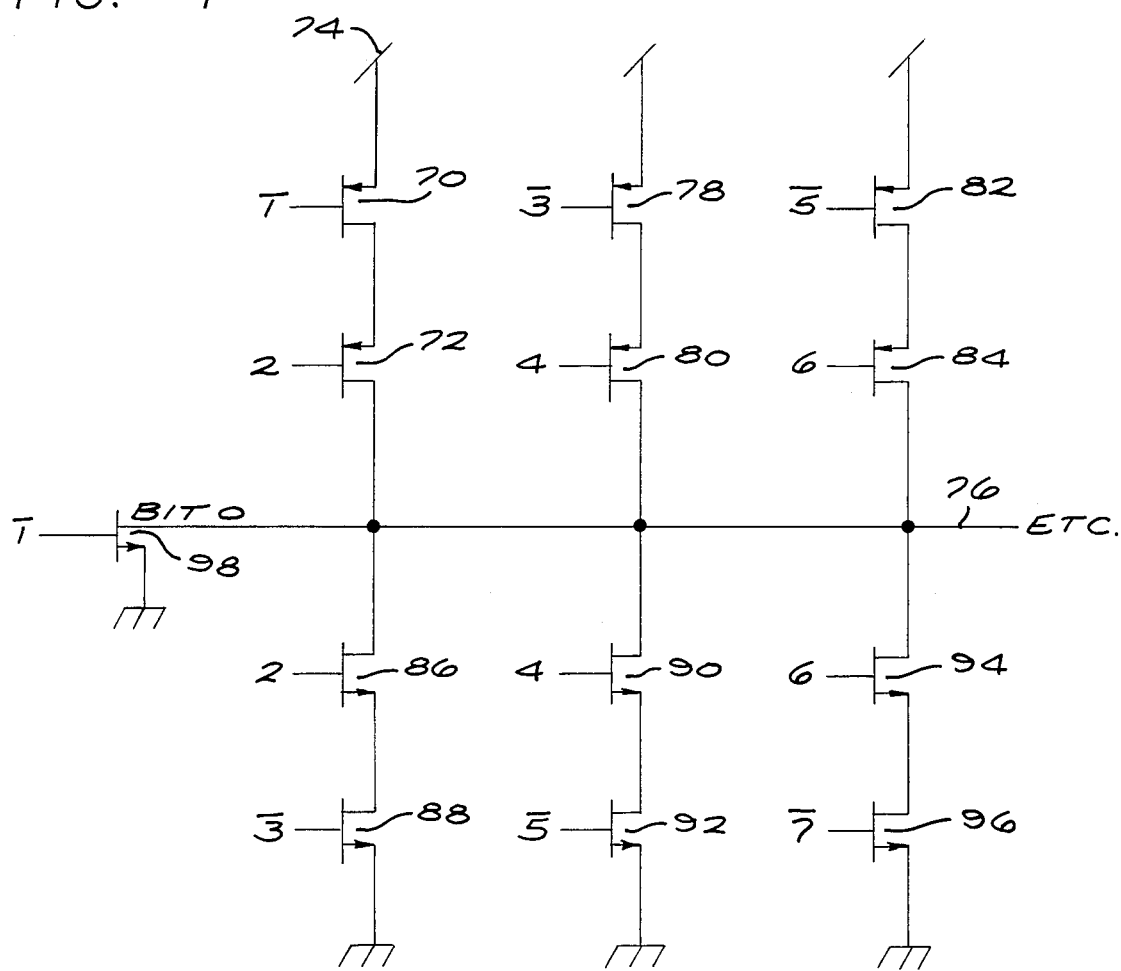
FIG. 4
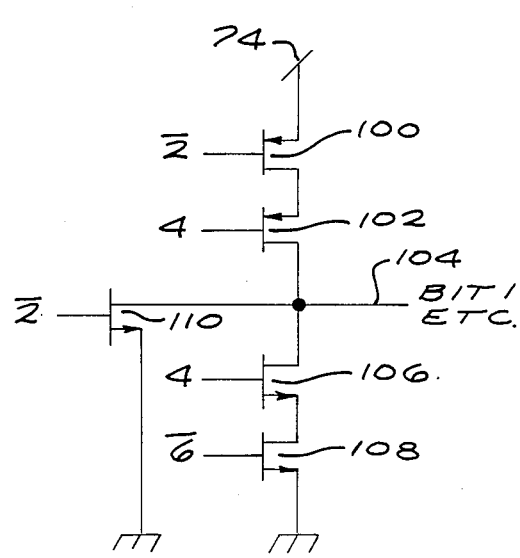
FIG. 5
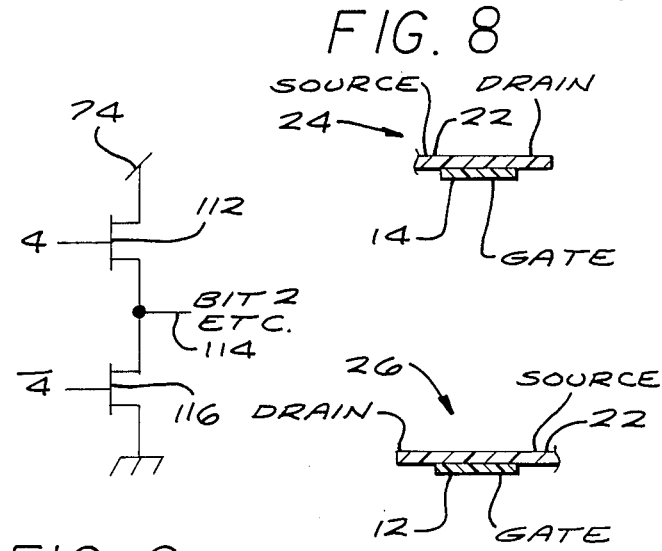
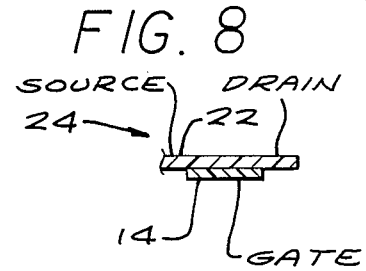
FIG. 6
FIG. 8
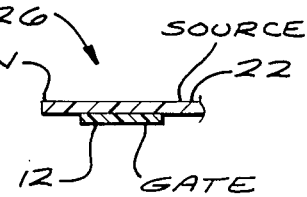
FIG. 9

FLASH ANALOG-TO-DIGITAL CONVERTER

This invention relates to apparatus for converting an analog value to a plurality of binary signals coding for the analog value. More particularly, the invention relates to a flash converter for converting an analog value to a position indicative on a line of the analog voltage, the line preferably being disposed on an integrated circuit chip. The invention further relates to apparatus for converting a position on a line on an integrated chip to a plurality of binary signals coding for such position on such line.

Systems are now in use for controlling the operation of complex equipment. For example, such systems may use measurements of such parameters as temperature and pressure. These measurements are made on an analog basis. The equipment uses these measurements to adjust controls in the equipment. The controls affect the parameters such as temperature and pressure. The adjusted values of temperature and pressure are then introduced to the equipment to provide further adjustments in the controls. In this way, the equipment is able to operate on a real time basis to provide a sensitive and reliable operation of the equipment to maintain the parameters such as temperature and pressure within precise limits.

Although the systems now in use operate on an analog basis to provide precise controls with respect to such parameters as temperature and pressure, the determinations in the adjustments to be made in such parameters are provided on a digital basis. Such data processing may be provided by data processing equipment such as microprocessors. Apparatus accordingly has to be provided in such system for converting the analog measurements of such parameters as temperature and pressure to digital signals which can be processed by the microprocessor. Similarly, digital signals are produced by the microprocessor to represent desired adjustments in the parameters such as temperature and pressure. These signals have to be converted to analog values in order to provide the desired adjustments in the parameters such as temperature and pressure.

Apparatus for converting analog values to corresponding digital values is generally more difficult to provide than apparatus for converting digital values to corresponding analog values. Flash converters are often used for analog-to-digital converters. These converters generally make progressive approximations in the digital values coding for the analog value by assuming digital values, converting the assumed digital values to an assumed analog value, comparing the assumed analog value with the actual analog value to generate an error signal and then correcting the assumed digital value to minimize the error signal.

The flash converters now in use include a plurality of discrete resistors which are connected in a series relationship to provide a resistance network. Different voltages are applied to the opposite terminals of the network to generate progressive reference voltages at terminals common to progressive pairs of resistances in the network. The analog value to be converted to the digital value is then compared with the reference voltages at the progressive terminals in the network. The results in such comparison are used to generate the assumed digital values discussed in the previous paragraph.

The flash converters now in use have certain distinct disadvantages. One disadvantage results from the fact that the resistances in the network are discrete. Since the resistances are discrete, individual ones of the resistances tend to have variations from a desired median value. This prevents the reference voltages at the terminals between progressive pairs of resistances in the network from having a relationship which rises linearly at the progressive terminals. Furthermore, the use of discrete resistances is expensive since the resistances are in themselves expensive and require electrical connections to be made to the terminals between the progressive pairs or resistances. As a result, flash converters now in use have integral and differential errors which prevent a precise conversion between analog and digital values from being performed.

The flash converters now in use also have other disadvantages. For example, it has been difficult to convert the position of correspondence between the input voltage and the voltage at an individual one of the terminals between progressive pairs of resistances into a plurality of signals coding in binary form for such position of correspondence. This has also contributed to the production of integral and differential errors in such flash converters in the conversion between analog and digital values.

A considerable effort has been made over a substantial number of years, and a significant amount of money has been expended during such time, to provide a flash converter which overcomes the disadvantages discussed above. In spite of such considerable effort and such signifant expenditure of money, the difficulties discussed above still persist. Specifically, the flash converters now in use display integral and differential errors which are relatively large in comparison to the accuracy provided by the other portions of the data processing systems in which such flash converters are included.

This invention provides a flash converter which overcomes the disadvantages discussed above. The flash converter provides a minumum amount of integral and differential errors. Furthermore, the flash converter can be produced at minimal expense on an integrated circuit chip of small size. The flash converter of this invention is also able to operate at high speeds in the order of hundreds of megacycles with great reliability.

In one embodiment of the invention, a line on an integrated circuit chip may be made from a suitable material (e.g. ion-implanted polysilicon) to provide a reference voltage linearly progressive with progressive line positions. This reference voltage may be produced by respectively introducing first and second reference voltages of different values to the opposite ends of the line. An input voltage having a value between the first and second reference voltages may be provided on a second line on the chip. The second line may be made from a suitable material (e.g. ion-implanted polysilicon) and a metal strap may be connected to opposite ends of the second line to provide substantially the same voltage at every position on the line.

The voltages at the progressive positions on the lines are compared in differential amplifiers to produce a signal having a first polarity for a voltage on the first line at least equal to the voltage on the second line and a signal having second polarity for a voltage on the first line less than the voltage on the second line. The signals from the differential amplifiers are combined in pluralities of logical circuits on the chip to produce a plurality of binary signals each having an individual binary significance. These signals cumultively code for the position at which the voltage on the first line corresponds to the input voltage on the second line.

A pair of transistors in each logical circuit may be connected in series to progressive ones of the differential amplifiers. Such progressive amplifiers are dependent upon the binary significance of the binary signal being produced. Alternate ones of the logical circuits in each plurality are connected in parallel to provide the binary signal of corresponding binary significance with a first magnitude representing a binary "1". The other logical circuits in each plurality are connected in parallel to provide the binary signal with a second magnitude representing a binary "0".

IN THE DRAWINGS:

FIG. 1 is a schematic diagram illustrating one embodiment of apparatus included in a flash converter;

FIG. 2 is a schematic electrical diagram of a differential comparator included in the flash converter shown in FIG. 1;

FIG. 3 is a truth table illustrating how signals produced in the flash converter of FIGS. 1 and 2 are converted to binary form;

FIG. 4 is a schematic circuit diagram illustrating how the voltages obtained from the system of FIGS. 1 and 2 are combined to produce a binary signal coding for the binary bit of least binary significance in the truth table shown in FIG. 3;

FIG. 5 is a schematic circuit diagram illustrating how the voltages obtained from the system of FIGS. 1 and 2 are combined to obtain a binary signal coding for the binary bit of second least binary significance in the truth table shown in FIG. 3;

FIG. 6 is a schematic circuit diagram illustrating how the voltages obtained from the system of FIGS. 1 and 2 are combined to produce a binary signal coding for the binary signal of third least binary significance in the truth table shown in FIG. 3;

FIG. 7 is a schematic view illustrating an integrated circuit chip which incorporates the system and circuit features of FIGS. 1, 2 and 4–6;

FIG. 8 is a sectional view taken on the line 8—8 of FIG. 1 and illustrates in additional detail the construction of one of the transistors included in the comparator of FIG. 2; and FIG. 9 is a sectional view taken on the line 9—9 of FIG. 1 and illustrates in additional detail the construction of the other one of the transistors included in the comparator of FIG. 2.

In one embodiment of the invention, an integrated circuit chip generally indicated at 10 includes a pair of lines 12 and 14 imprinted on the chip. The lines 12 and 14 may be made from a suitable material such as polysilicon. The lines 12 and 14 may be ion-implanted. One end of the line 12 may be provided with a reference potential such as a ground 16. The other end of the line 12 may receive a reference potential different from ground. For example, the line 12 may receive a positive reference potential of $V_{REF}$ from a source 18.

The line 14 receives an input voltage such as $V_{IN}$ from a source 20. The voltage $V_{IN}$ is between the reference potential such as ground and the reference potential such as $V_{REF}$. The line 12 may be so heavily ion-implanted that the voltage $V_{IN}$ is provided at every position on the line. Alternatively, a metal strap may be connected to the line 14 at progressive positions along the line, or at opposite ends of the line, to obtain the voltage $V_{IN}$ at every position on the line.

A plurality of bridging layers 22 are disposed on the layers 12 and 14 in electrically insulating relationship to the lines 12 and 14. The layers 22 are preferably disposed in uniformly spaced relationship to one another and in perpendicular relationship to the layers 12 and 14. Each of the layers 22 may be made from a suitable material such as an actively diffused silicon. Since the layers 22 are made from an actively diffused silicon, the same voltage is produced at every position on each line. As will be appreciated, the lines 12 and 14 and the bridging layers are shown considerably enlarged in FIG. 1 from the dimensions which they would actually occupy on the integrated circuit chip 10.

Each of the layers 22 receives a suitable voltage E (FIG. 2) and is connected to the sources of a pair of transistors 24 and 26 in a differential amplifier generally indicated at 28. The gates of the transistors 24 and 26 in each of the differential amplifiers 28 respectively receive the input voltage $V_{IN}$ and the reference voltage at the position on the line 12 adjacent to the associated one of the bridging layers 22. The outputs from each of the differential amplifiers 24 and 26 is obtained from the drains of such transistors. The differential amplifier 28 is shown somewhat schematically in FIG. 2 since it may be constructed in a manner well known in the art.

The gate of each transistor 26 may be the line 12 (FIGS. 2 and 9) at a position contiguous to the associated bridging layer 22. The source of each transistor 26 may be the associated bridging layer 22 (FIGS. 2 and 9) at a position contiguous to the line 12 on one side of the line 12. The drain of each transistor 26 may be the associated bridging layer 22 (FIGS. 2 and 9) at a position contiguous to the line 12 on the other side of the line from the source of such transistor. Similarly, the gate of each transistor 24 may be the line 14 (FIGS. 2 and 8) at a position contiguous to the associated bridging layer 22. The source of each transistor 28 may be the associated bridging layer 22 (FIGS. 2 and 8) at a position contiguous to the line 14 on one side of the line 14. The drain of each transistor 28 may be the associated bridging layer 22 (FIGS. 2 and 8) at a position contiguous to the line 14 on the other side of the line from the source of such transistor. Actually, the arrangement shown in FIG. 1 may be considered to constitute a bottom plan view such that the lines 12 and 14 would actually be above the bridging layers 22.

Since the line 14 is ion-implanted, the voltage $V_{IN}$ is heavily produced at every position on the line. In contrast, the voltage on the line 12 varies linearly and progressively, at successive positions on the line, from the voltage $V_{REF}$ at one end of the line to the ground potential at the other end of the line. At some position on the line 12, the reference potential on the line 12 corresponds to the voltage $V_{IN}$ on the line 14. This position on the line 12 is dependent upon the magnitude of the input voltage $V_{IN}$.

The voltage on the line 12 at each successive position on the line is compared with the input line $V_{IN}$ in the differential amplifier 28 for that successive position. This comparison results from the respective introduction of the reference voltage for that position and the line voltage to the differential amplifier 28 for that position. When the reference voltage at that position is at least equal to the input voltage, the differential amplifier 28 at that position on the line 12 produces a signal of a first polarity. On the other hand, the differential amplifier 28 for that position produces a signal of an opposite polarity when the reference voltage at that position on the line 12 is less than the input voltage $V_{IN}$. In this way, all of the differential amplifiers 28 below a position 32 in FIG. 1 produces a signal of the second polarity and all of the differential amplifiers 28 above the position 32 in FIG. 1 produce the signal of the first polarity.

It will be appreciated that the differential amplifier 28 is shown in FIG. 2 on a schematic basis. For example, the transistors in the differential amplifier are shown as n-type. They may also be p-type. One of the transistors may also be n-type and the other may be p-type. However, under such circumstances, an inverter would have to be included with one of the transistors. Furthermore, the differential amplifier 28 may have to be more complicated than that shown in FIG. 2 but this construction would be known to a person skilled in the art.

FIG. 3 is a truth table illustrating how a plurality of binary coded signals are produced to code for the polarities of the signals from the amplifiers 28. As will be seen in FIG. 3, the last seven (7) columns at the right in FIG. 3 indicate a signal of one polarity by the letter "L" (low) and a signal of the opposite polarity by the letter "H" (high). Each of the last seven (7) columns in FIG. 3 represents the operation of a successive one of the differential amplifiers 28 in the upward direction of the line 12 in FIG. 1. As the input voltage $V_{IN}$ increases in FIG. 3, the differential amplifiers 28 at progressive ones of the bridging layers 22 change from an "L" operation to an "H" operation.

In the first three (3) columns, FIG. 3 also illustrates a plurality of signals in binary coded form. These signals indicate in binary coded form the analog value represented by the signals in the last seven (7) columns of FIG. 7. Specifically, the signals in the first three (3) columns of FIG. 3 specify in binary coded form the position at which each of the progressive the differential amplifiers 28 changes from an "L" indication to an "H" indication. In the first three (3) columns of FIG. 3, a "0" indicates a false binary indication and a "1" indicates a true binary indication.

FIGS. 4 through 6 indicate circuitry for converting the indications in the last seven (7) lines of FIG. 3 to the indications in the first three (3) columns of FIG. 3. FIG. 4 illustrates circuitry for producing signals coding for the binary bit of least binary significance. The value of this binary bit is shown in the third column in FIG. 3. As will be seen, the value of this binary bit changes alternately between binary values of "0" and "1". For example, for an analog value of "2", the differential amplifier at the "1" position (the fourth column in FIG. 3) on the lines 12 and 14 produces a "A" signal and the differential amplifier 28 at the "2" position on the lines 12 and 14 produces a "L" signal.

A pair of transistors 70 and 72 are accordingly connected in series in FIG. 4 to represent a condition as expressed in the previous paragraph. The gate of the transistor 70 receives an "L" signal from the differential amplifier at the "1" position on the lines 12 and 14. The gate of the transistor 72 receives an "H" signal from the differential amplifier at the "2" position on the lines 12 and 14. This is represented by a "1" for the gate of the transistor 70 and by a "2" for the gate of the transistor 72. The transistors 70 and 72 may be of the p-type. The source of the transistor 70 is connected to a source 74 providing a positive voltage and the drain of the transistor 72 is connected to an output line 76. In this way, a signal passes through a circuit including the voltage source 74, the transistor 70 and the transistor 72 when the signal from the differential amplifier at the "1" position on the lines 12 and 14 is low and the signal from the differential amplifier at the "2" position on the lines 12 and 14 is high.

Similar circuits to that described in the previous paragraph are provided to indicate a low signal for an analog value of "3" and a high signal for an analog value of "4". This is provided by a circuit including transistors 78 and 80. In like manner, a circuit including a transistor 82 and a transistor 84 may be provided to pass a current when the differential amplifier 28 at the "5" position on the lines 12 and 14 produces an "L" signal and the differential amplifier at the 6 position on the lines 12 and 14 produces a "H" signal. Thus, as will be seen, the output line 76 has a high voltage when any one of the lines represented by the transistors 70 and 72, the transistors 78 and 80 and the transistors 82 and 84 passes a current from the voltage source 74.

The circuitry described above provides a signal on the line 76 when the differential amplifiers at the different positions on the lines 12 and 14 indicate that the correspondence between the voltages on the lines 12 and 14 occurs at an even one of the differential amplifiers such as those indicated at positions "2", "4" and "6" on the line 12. FIG. 4 also provides circuitry which produces a voltage on the output line 76 when the correspondence between the voltages on the lines 12 and 14 occurs at an odd one of the differential amplifiers such as those at the "1", "3" and "5" positions on the line 12.

As shown in FIG. 4, a pair of transistors 86 and 88 are in series to indicate when the position of correspondence between the voltages on the lines 12 and 14 occurs at position "3" on the lines. Each of the transistors 86 and 88 may be of the "N" type. A signal is introduced to the gate of the transistor 86 from the differential amplifier 28 at position "2" on the lines 12 and 14 to indicate an "H" value and a signal is introduced to the gate of the transistor 88 to indicate an "L" value at position 3 on the line. The source of the transistor 86 has a common connection with the output line 76. The drain of the transistor 86 and the source of the transistor 88 have a common connection. The drain of the transistor 88 is common with a reference potential such as ground. In this way, for a binary value of "3", the transistors 86 and 88 become conductive and the output line 76 receives the reference potential such as ground.

Similarly, transistors 90 and 92 are connected in series to indicate that the correspondence between the voltages on the lines 12 and 14 occur at the "5" position on the lines. The gate of the transistor 90 accordingly receives an "H" signal from the differential amplifier 28 at position "4" on the lines 12 and 14 and the gate of the transistor 92 receives an "L" signal from the differential amplifier at position "5" on the lines 12 and 14. Transistors 94 and 96 are connected in a similar circuit to pass a current when the transistor 94 receives an "H" signal from the differential amplifier 28 at position "6" on the lines 12 and 14 and the transistor 96 receives an "L" signal from the differential amplifier at position "7" on the lines 12 and 14. A transistor 98 may be connected between the line 76 and the reference such as ground to produce a ground potential on the line 76 when the differential amplifier at the "1" position on the lines 12 and 14 produces an "L" signal.

As will be seen, a voltage approaching the potential from the source 74 is produced on the output line 76 when the lines 12 and 14 have equal voltags on the lines at a position corresponding to one of the even positions (2, 4, 6, etc.). A voltage approaching the reference potential such as ground is produced on the output line 76 when the lines 12 and 14 have equal voltages on the lines at a position corresponding to one of the odd positions (1, 3, 5, etc.). This corresponds to the showing in the third column of FIG. 3.

FIG. 5 illustrates the circuitry which is provided to produce a signal coding for the second least significant binary bit. As will be seen, the logic level of the second least significant binary bit changes for alternate analog values. For example, the logic level of the second least significant binary bit changes from "0" to "1" with increases in analog value from "2" to "3" and from "6" to "7" and changes from "1" to "0" with increases in analog value from "4" to "5". A change in analog value from "2" to "3" is represented by an "L" in the differential amplifier 28 at the position "2" in the lines 12 and 14 and by a "H" in the differential amplifier at position "4" in the lines 12 and 14. This is provided in transistors 100 and 102 in FIG. 5. The gate of the transistor 100 receives an "L" signal as represented by a 2 and the gate of the transistor 102 receives an "H" signal as represented by "4". The source of the transistor 100 receives a potential from the voltage source 74. An output line 104 is common with the drain of the transistor 102. The source of the transistor 100 and the drain of the transistor 102 are common. As will be seen, when the transistors 100 and 102 are conductive, a voltage approaching that from the source 74 is produced on the output line 106.

In like manner, a series circuit including transistors 104 and 106 is connected to the line 104 when the transistors are conductive. A change in analog value from "4" to "5" is represented by an "H" in the differential amplifier 28 at the position "4" on the lines 12 and 14 and by an "L" in the differential amplifier at position "6" in the lines 12 and 14. A transistor 110 is also provided in parallel with the series circuit defined by the transistors 106 and 108. The gate of the transistor 110 receives an "L" to indicate a binary "0" for the first two differential amplifiers 28 in the lines 12 and 14. This is indicated by a value of "2" in FIG. 5. Thus, the gate of the transistor 110 receives an "H" signal for analog values other than an analog value of "2".

As will be seen, a voltage approaching the potential from the source 74 is produced on the output line 104 when the lines 12 and 14 have equal voltages on the lines at a position corresponding to alternate ones of the even positions on the lines (4, 8, 12, etc.). A voltage approaching the reference potential such as ground is produced on the output line 104 when the lines 12 and 14 have equal voltages on the lines at a position corresponding to the other ones of the even positions (2, 6, 10, etc.). This corresponds to the showing in the second column of FIG. 3.

FIG. 6 illustrates how the signals are produced for the third least significant binary bit. A transistor 112 is provided to produce a signal when the differential amplifier 28 at the "4" position on the lines 12 and 14 has an "H" value. Similarly, a transistor 116 produces a signal when the differential 28 at the "4" position on the lines 12 and 14 has an "L" position. In this way, a voltage approaching ground is produced on a line 114 for binary values between "1" and "4" and a voltage approaching the potential on the source 74 is produced on the line 114 for binary values between "5" and "8". This is consistent with the indications in the first column of FIG. 3.

It will be appreciated that FIGS. 4, 5 and 6 show circuitry for indicating only three binary bits. However, a person skilled in the art will appreciate how to construct a system with additional binary bits since the system is recursive. The system shown in FIG. 1 and the circuitry shown in FIGS. 4, 5 and 6 can be disposed on an integrated circuit chip as illustrated schematically at 130 in FIG. 7.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination in a flash converter,
an integrated circuit chip,
a first ion-implanted line disposed on the integrated circuit chip and constructed to provide a substantially constant voltage at every position on the line,
means for introducing an input voltage to the first line,
a second ion-implanted line disposed on the integrated circuit chip and constructed to provide progressive voltages at progressive positions on the line,
means for introducing first and second reference voltages to opposite ends of the second line to produce a reference voltage of progressive values at progressive positions on the line,
a plurality of ion-implanted bridging layers each disposed between the first and second lines at a progressively spaced position along the lines relative to the disposition of the other bridging layers along the lines, each of he bridging layers being constructed to provide a substantially constant voltage at every position on the bridging layer,
means for introducing an energizing voltage to the bridging layers,
each of the bridging layers being disposed in insulating relationship to the first and second lines, and
means responsive to the energizing voltage on each bridging layer for comparing the input voltage on the first line with the reference voltage on the second line at the position of the bridging layer to determine the bridging layer at which the voltages on the first and second lines are substantially equal.

2. In a combination as set forth in claim 1,
the first and second lines being formed from polysilicon, the first line being heavily ion-implanted.

3. In a combination as set forth in claim 2,
the bridging layers being formed from polysilicon and being heavily ion-planted.

4. In a combination as set forth in claim 2,
the comparing means including a plurality of differential comparators each having first and second semi-conductors with first, second and third electrodes, the first and second semi-conductors in each comparator being associated with an individual one of the bridging layers,
the first electrodes in the semi-conductors of each comparator being connected to the associated bridging layer,
means for introducing the voltage on the first line to the second electrode of the first semi-conductor in each of the differential comparators in the plurality, means for introducing the voltage on the second line at the position of the associated bridging layer to the second electrode of the second semi-conductor in the differential comparator associated with such bridging layer, and means for determining the input voltage from the relative values of the voltages on the third electrodes in the semi-conductors in each of the differential comparators in the plurality.

5. In combination in a flash converter, an integrated circuit chip, a first ion-implanted polysilicon line disposed on the chip and constructed to provide linearly progressive voltages at progressive positions on the line, means for respectively introducing first and second reference voltages to opposite ends of the line to produce at progressive positions on the line voltages progressively varying between the first and second voltages, a second polysilicon line heavily implanted with ions, means for introducing an input voltage to the second line, a plurality of bridging layers each made from polysilicon heavily implanted with ions, each of the bridging layers bridging the first and second positions at a progressive position along the lines, each of the bridging layers being disposed in insulated relationship to the first and second lines, means for introducing an energizing voltage to the bridging layers, a plurality of comparators, each of the comparators being responsive to the energizing voltage at the associated bridging layer for comparing the input voltage with the reference voltage at the position of the associated bridging layer to determine any difference between the input and reference voltages, each of the bridging layers being disposed relative to the first and second lines to operate in conjunction with the first and second lines to provide for the determination of the difference between the input and reference voltages at the position of each bridging layer, the second line being disposed in substantially parallel relationship with the first line and the bridging layers being disposed in substantially perpendicular relationship to the first and second lines, and means for determining the bridging layer at which the reference voltage on the first line corresponds to the input voltage on the second line.

6. In a combination as set forth in claim 5, each of the comparators being formed from a pair of transistors each having a source, a gate and a drain, the sources of the transistors in each of the comparing means being connected to the associated bridging layer, the gate of one transistor in each comparing means being connected to the first line at the position of the associated bridging layer and the gate of the other transistor in each comparing means being connected to the second line at the position of the associated bridging layer, and means for determining the relative voltages on the first and second lines at the position of each bridging layer in accordance with the relative voltages on the drains of the transistors in the associated comparing means.

7. In a combination as set forth in claim 5, means for converting to a plurality of signals in binary coded form the bridging layer at which the input voltage corresponds to the reference voltage.

8. In a combination as set forth in claim 6, means responsive to the polarity of the difference in voltage on the drains of the transistors in each of the different comparing means for producing an ouput signal representative of such polarity, and means for combining the output voltages from the different comparing means in different logical relationships to provide binary indications of the input voltage.

9. In combination in a flash converter, an integrated circuit chip, a first line disposed on the chip and constructed to provide linearly progressive voltages at progressive positions on the line, means for producing on the first line a reference voltage having a progressive value at progressive positions on the first line, a second line disposed in substantially and parallel relationship to the first line and constructed to provide the same voltage at progressive positions on the line, means for introducing an input voltage to the second line, a plurality of bridging layers each extending in a substantially perpendicular relationship to the first and second lines at a progressive position along the lines to provide for the production of a binary signal indicative of whether the input voltage is greater or less than the reference voltage at such bridging layer, each of the bridging layers being disposed in insulated relationship to the first and second lines, each of the bridging layers being disposed relative to the first and second lines to operate in conjunction with the first and second lines to provide for the determination of the difference between the input and reference voltages at the position of such bridging layer, means for comparing the input voltage and the reference voltage at the position of each of the bridging layers, and means responsive to the binary signals from the comparing means for converting to a plurality of signals in binary coded form the reference voltage at the bridging layer where the line voltage and the reference voltage are substantially equal.

10. In a combination as set forth in claim 9, each of the binary indications from the comparing means respectively having first and second logical levels respectively coding for binary "1" and binary "0" and having the first logic level for a greater magnitude of the reference voltage at the associated bridging layer than the input voltage and having the second logic level for the input voltage being greater in magnitude than the reference voltage at the associated bridging layer, the converting means including a plurality of logical networks responsive to the binary signals and connected in a particular series and parallel relationship to produce the binary signals indicative of the reference voltage at the position of the bridging layer where the reference and line voltages are substantially equal.

11. In a combination as set forth in claim 10, each of the logical networks including two transistors, one of the transistors being connected to receive, from one of the comparing means with a first reference voltage, a binary signal having a relatively low logic level and the other transistor being connected to receive, from another one of the comparing means with a different reference voltage relative to the first reference voltage, a binary signal having a relatively high logic level.

12. In combination in a flash converter,
a first line constructed to provide the same voltage at progressive positions along the line,
means for introducing an input voltage to the first line,
a second line constructed to provide, at progressive positions along the second line, a reference voltage having a value progressively variable at such progressive positions,
means for introducing first and second voltages to opposite ends of the second line to obtain the production of progressive reference voltages at progressive positions along the second line,
the second line being disposed in substantially parallel relationship to the first line,
a plurality of bridging layers each disposed between the first and second lines at a progressive position along the lines, each of the bridging layers being disposed in insulated relationship to the first and second lines,
means including the bridging layers for comparing the input voltage with the reference voltage at the progressive bridging layers to provide results of the comparison at each of the progressive bridging layers and to provide an indication of the bridging layer at which the input voltage and the reference voltage are substantially equal,
a plurality of logical networks,
each of the logical networks including two transistors in series, one of the transistors in each logical network being connected to receive the binary signal from one of the comparing means with a relatively low reference voltage to produce a signal with the first logic level and the other transistor in such logical network being connected to receive the binary signal from another one of the comparing means with an increased reference voltage to produce a signal with the second logic level,
means for providing a plurality of bit lines each having an individual binary significance and each connected to provide an individual one of the signals in the binary code,
means for providing an energizing voltage,
means for providing an individual reference voltage lower than the energizing voltage, and
first ones of the logical networks being connected in parallel between the energizing voltage means and the bit line means and second ones of the logical networks being connected between the bit line means and the means providing the individual reference voltage.

13. In a combination as set forth in claim 12,
the relationship between the comparing means connected to each of the two transistors in each logical network being dependent upon the binary significance of the bit line to which the logical network is connected.

14. In a combination as set forth in claim 13,
an integrated circuit chip, the input voltage means, the reference voltage means, the comparing means, the binary bit means and the logical network means being disposed on the integrated circuit chip,
the first line and the second line being disposed on the chip in substantially parallel and contiguous relationship and the bridging layers being disposed on the chip in substantially perpendicular relationship to the first and second lines, and
the first and second lines and the bridging layer being made from an ion-implanted material and the first line and the bridging layers being heavily ion-implanted.

15. In a combination as set forth in claim 14,
the logical networks connected between the energizing voltage means and the bit line means receiving a binary "0" from the comparing means of reduced binary significance and a binary "1" from the comparing means of increased binary significance and the logical networks connected between the bit line means and the reference voltage means receiving a binary "1" from the comparing means of reduced binary significance and a binary "0" from the comparing means of increased binary significance.

16. In combination in a flash converter,
an integrated circuit chip,
a first ion-implanted line disposed on the integrated circuit chip and constructed to provide a substantially constant voltage at every position on the line,
means for introducing an input voltage to the first line,
a second ion-implanted line disposed on the integrated circuit chip and constructed to provide progressive voltages at progressive positions on the line,
means for introducing first and second reference voltages to opposite ends of the second line to produce a reference voltage of progressive values at progressive positions on the line,
a plurality of ion-implanted bridging layers each disposed on the integrated circuit chip between the first and second lines at a progressively displaced position along the lines relative to the disposition of the other bridging layers along the lines, each of the bridging layers being constructed to provide a substantially constant voltage on the bridging layer and being disposed in electrically insulating relationship to the lines,
the adjacent position between the first line and each of the bridging layers defining the position of a first transistor and the adjacent position between the second line and each such bridging layer defining the position of a second transistor for operation with the first transistor to compare the voltage on the first line and the voltage on the second line at such adjacent positions.

17. In a combination as set forth in claim 16,
the first and second lines being substantially parallel and the bridging layers being substantially perpendicular to the first and second lines.

18. In combination in a flash converter,
an integrated circuit chip,
a first line disposed on the integrated circuit chip and constructed to provide a substantially constant voltage at every position on the line,
a second line disposed on the integrated circuit chip and constructed to provide a progressive voltage at progressive positions on the line, means for introducing an input voltage to the first line, means for introducing first and second reference voltages to the opposite ends of the second line, a plurality of bridging layers each disposed on the integrated circuit chip between the first and second lines and constructed to provide a substantially constant voltage at every position on such bridging layer, each of the bridging layers being disposed in electrically insulating relationship to the first and second lines, and means defining transistors at the positions of intersection of the bridging layers with the first and second lines, the transistors at the opposite ends of the bridging layers being paired, the voltage on the first line being introduced to the individual ones of the transistors defined at the positions of intersection of the first line and the bridging layers, the voltages on the second line being introduced to the individual ones of the transistors defined at the positions of intersection of the second line and the bridging layers, and means for connecting the transistors in each pair to obtain a comparison of the voltages on the first and second lines in the transistors in such pairs.

19. In a combination as set forth in claim 18, the first and second lines being substantially parallel and the bridging layers being substantially perpendicular to the first and second lines.

20. In a combination as set forth in claim 19, the first and second lines and the bridging layers being ion-implanted and the first line and the bridging layers being heavily ion-implanted.

21. In a combination as set forth in claim 20, the first and second lines and the bridging layers being formed from polysilicon.

* * * * *